(12) United States Patent
Deak et al.

(10) Patent No.: US 11,255,927 B2
(45) Date of Patent: Feb. 22, 2022

(54) THREE-AXIS UPSTREAM-MODULATED LOW-NOISE MAGNETORESISTIVE SENSOR

(71) Applicant: MultiDimension Technology Co., Ltd., Zhangjiagang (CN)

(72) Inventors: James Geza Deak, Zhangjiagang (CN); Zhimin Zhou, Zhangjiagang (CN)

(73) Assignee: MultiDimension Technology Co., Ltd., Zhangjiagang (CN)

( * ) Notice: Subject to any disclaimer, the term of this patent is extended or adjusted under 35 U.S.C. 154(b) by 15 days.

(21) Appl. No.: 15/733,446

(22) PCT Filed: Jan. 29, 2019

(86) PCT No.: PCT/CN2019/073734
§ 371 (c)(1),
(2) Date: Jul. 30, 2020

(87) PCT Pub. No.: WO2019/149197
PCT Pub. Date: Aug. 8, 2019

(65) Prior Publication Data
US 2021/0103009 A1    Apr. 8, 2021

(30) Foreign Application Priority Data
Jan. 30, 2018    (CN) .......................... 201810089692.X

(51) Int. Cl.
*G01R 33/02* (2006.01)
*G01R 33/00* (2006.01)
*G01R 33/09* (2006.01)

(52) U.S. Cl.
CPC ...... *G01R 33/0206* (2013.01); *G01R 33/0011* (2013.01); *G01R 33/0041* (2013.01); *G01R 33/0094* (2013.01); *G01R 33/09* (2013.01)

(58) Field of Classification Search
CPC ............ G01R 33/0206; G01R 33/0011; G01R 33/0041
See application file for complete search history.

(56) References Cited

U.S. PATENT DOCUMENTS 8,222,898 B1    7/2012 Edelstein
9,891,292 B2 *  2/2018 Deak .................. G01R 33/0206
(Continued)

FOREIGN PATENT DOCUMENTS

CN    103913709    7/2014
CN    104280700    1/2015
(Continued)

OTHER PUBLICATIONS

"International Application No. PCT/CN2019/073734, International Search Report and Written Opinion dated Apr. 15, 2019", (Apr. 15, 2019), 19 pgs.

*Primary Examiner* — Reena Aurora
(74) *Attorney, Agent, or Firm* — Schwegman Lundberg & Woessner, P.A.

(57) ABSTRACT

A three-axis upstream-modulated low-noise magnetoresistive sensor comprises an X-axis magnetoresistive sensor, a Y-axis magnetoresistive sensor, and a Z-axis magnetoresistive sensor, wherein the X, Y, and Z-axis magnetoresistive sensors respectively comprise X, Y, and Z-axis magnetoresistive sensing unit arrays, X, Y, and Z-axis soft ferromagnetic flux concentrator arrays, and X, Y, and Z-axis modulator wire arrays. The X, Y, and Z-axis magnetoresistive sensing unit arrays are electrically interconnected into X, Y, and Z-axis magnetoresistive sensing bridges respectively. The X, Y, and Z-axis modulator wire arrays are electrically interconnected into individual two-port X, Y, and Z-axis excitation coils. In order to measure external magnetic fields, the two-port X, Y, and Z-axis excitation coils are separately supplied with high-frequency alternating current (Continued)

at a frequency f, from a current supply. The X-axis magnetoresistive sensor, Y-axis magnetoresistive sensor, and Z-axis magnetoresistive sensor each output harmonic signal components having a frequency of 2f, which are then demodulated to obtain the X, Y, and Z-axis low-noise signals. This device is small in size, has low noise, and a simple structure.

14 Claims, 12 Drawing Sheets

(56) References Cited

U.S. PATENT DOCUMENTS

| | | |
|---|---|---|
| 10,066,940 B2 | 9/2018 | Deak et al. |
| 10,107,871 B2 | 10/2018 | Deak et al. |
| 11,067,647 B2 * | 7/2021 | Deak .................. G01R 33/09 |
| 2017/0176545 A1 | 6/2017 | Deak et al. |
| 2017/0211935 A1 | 7/2017 | Deak et al. |
| 2018/0149715 A1 | 5/2018 | Deak et al. |
| 2020/0209325 A1 * | 7/2020 | Makino ................ G01R 33/09 |
| 2020/0217908 A1 * | 7/2020 | Deak .................. G01R 33/093 |

FOREIGN PATENT DOCUMENTS

| | | |
|---|---|---|
| CN | 105093139 | 11/2015 |
| CN | 205353331 | 6/2016 |
| CN | 106842079 A | 6/2017 |
| CN | 107037382 A | 8/2017 |
| CN | 107422283 A | 12/2017 |
| CN | 108413992 A | 8/2018 |
| CN | 207963906 U | 10/2018 |
| WO | WO-2019149197 A1 | 8/2019 |

* cited by examiner

THREE-AXIS UPSTREAM-MODULATED LOW-NOISE MAGNETORESISTIVE SENSOR

PRIORITY CLAIM TO RELATED APPLICATIONS

This application is a U.S. national stage filing under 35 U.S.C. § 371 from International Application No. PCT/CN2019/073734, filed on 29 Jan. 2019, and published as WO2019/149197 on 8 Aug. 2019, which claims the benefit under 35 U.S.C. 119 to Chinese Application No. 201810089692.X, filed on 30 Jan. 2018, the benefit of priority of each of which is claimed herein, and which applications and publication are hereby incorporated herein by reference in their entirety.

TECHNICAL FIELD

The present invention relates to the field of magnetic sensors, and in particular, to a three-axis upstream-modulated low-noise magnetoresistive sensor.

BACKGROUND

There is 1/f noise in a magnetoresistive sensor during normal use. It is of current interest to reduce the 1/f noise of magnetoiresistive sensors as well as to find methods for supporessing it. In general, a magnetoresistive sensor has high 1/f noise at low frequency, while a magnetoresistive sensor mainly has thermal noise at a high frequency; the noise energy density of the latter is much lower than that at the low frequency. Thus, a magnetic signal is selectively pre-modulated to a high-frequency magnetic field, then it is measured by the magnetoresistive sensor which outputs a high-frequency voltage signal, and the signal is then demodulated for the purpose of moving the measurement of the magnetic signal from a low-frequency region to a high-frequency region, thereby reducing the magnitude of the 1/f noise.

Previous attempts to do so have been performed using a MEMS technology solution, wherein a vibrating structure including a soft ferromagnetic flux concentrator is built onto the surface of the magnetoresistive sensor, and the soft ferromagnetic flux concentrator is driven such that it vibrates periodically on the surface of the magnetoresistive sensor for modulating a static external magnetic field. This technology is conducive to reducing the 1/f noise of the magnetoresistive sensor; however, the complexity and size of the magnetoresistive sensor as well as the complexity of the process are increased greatly with the addition of the vibrating structure and a driver.

A three-axis magnetoresistive sensor may be used as an electronic compass since it can measure all three components of the ambient magnetic field. In general, a measurement performed by the three-axis magnetoresistive sensor is carried out in the static magnetic field when it performs a three-axis measurement of the ambient magnetic field, so there is 1/f noise, which affects measurement accuracy of the ambient magnetic field. Therefore, the present invention is aimed at providing a three-axis upstream-modulated low-noise magnetoresistive sensor, which can achieve high-frequency output of a measurement signal, so as to obtain a low-noise measurement signal.

SUMMARY OF THE INVENTION

A three-axis upstream-modulated low-noise magnetoresistive sensor is proposed in the present invention, which can achieve high-frequency output of a measurement signal, so as to obtain a low-noise measurement signal.

A three-axis magnetoresistive sensor includes an X-axis magnetoresistive sensor, a Y-axis magnetoresistive sensor, and a Z-axis magnetoresistive sensor. The X-axis magnetoresistive sensor and an associated set of soft ferromagnetic flux concentrators includes: 1. a single-chip reference bridge magnetoresistive sensor, including strings of sensing magnetoresistive units located in the gaps of the soft ferromagnetic flux concentrators and reference magnetoresistive sensing unit strings located above the upper surfaces or below the lower surfaces of the soft ferromagnetic flux concentrators; 2. a single-chip high-sensitivity push-pull magnetoresistive sensor, which obtains an +X push magnetoresistive sensing unit array and an −X pull magnetoresistive sensing unit array by means of scanning laser thermal annealing, and it includes a soft ferromagnetic flux concentrator array to enhance sensitivity; 3. a flip die push-pull bridge magnetoresistive sensor, which includes a soft ferromagnetic flux concentrator to enhance sensitivity, wherein a push magnetoresistive sensing unit and a pull magnetoresistive sensing unit are implemented by flipping a die by 180 degrees;

4. an X-axis push-pull bridge magnetoresistive sensor with U-shaped soft ferromagnetic flux concentrators, wherein an opening direction of the U-shaped soft ferromagnetic flux concentrators is alternately a +Y direction and a −Y direction, two adjacent ones of the U-shaped soft ferromagnetic flux concentrators are interdigitated, sensing directions of the magnetoresistive sensing units are the same and are an X direction, and a push magnetoresistive sensing unit string and a pull magnetoresistive sensing unit string are alternately located in an interdigitated gap; and 5. an X-axis push-pull magnetoresistive sensor with U-shaped soft ferromagnetic flux concentrators and H-shaped soft ferromagnetic flux concentrators, wherein openings of the H-shaped soft ferromagnetic flux concentrators and the U-shaped soft ferromagnetic flux concentrators are all toward the +Y direction or the −Y direction, two adjacent ones of the H-shaped soft ferromagnetic flux concentrators or the U-shaped and H-shaped soft ferromagnetic flux concentrators are interdigitated, sensing directions of the magnetoresistive sensing units are the same and are the X direction, and the push magnetoresistive sensing unit string and the pull magnetoresistive sensing unit string are alternately located in the interdigitated gap.

The Y-axis magnetoresistive sensor is also one of the following types: 1. the X-axis magnetoresistive sensor is flipped by 90 degrees; 2. a +Y push magnetoresistive sensor unit array and a −Y pull magnetoresistive sensor unit array are directly written by means of scanning laser thermal annealing, utilizing a soft ferromagnetic flux concentrator array to enhance sensitivity; 3. two comb-shaped soft ferromagnetic flux concentrators are interdigitated, wherein the comb seat is parallel to the X direction, the comb teeth are opened in the Y direction, the magnetic field sensing directions of the magnetoresistive sensing units are along the X axis, and the push magnetoresistive sensing unit string and the pull magnetoresistive sensing unit string are alternately located in the interdigitated gaps; 4. a Y-axis push-pull magnetoresistive sensor with two rectangular block arrays of soft ferromagnetic flux concentrators crossing along the X direction and misaligned along the Y direction is adopted, wherein soft ferromagnetic blocks corresponding to one soft ferromagnetic flux concentrator array are located on the left or the right of a gap of the other soft ferromagnetic flux concentrator array, sensing directions of the magnetoresistive sensing units are all the X direction, and the push magnetoresistive sensing unit string and the pull magnetoresistive sensing unit string are alternately located in the middle of a gap formed by two adjacent soft ferromagnetic flux concentrators.

A soft ferromagnetic flux concentrator array is used in the Z-axis magnetoresistive sensor, wherein the push magnetoresistive sensing unit string and the pull magnetoresistive sensing unit string are respectively located at two positions above or below surfaces of the soft ferromagnetic flux concentrators respectively and equidistant from the Y-axis center line.

According to a specific aspect of the present invention, a three-axis upstream-modulated low-noise magnetoresistive sensor includes a substrate, and X, Y, and Z-axis upstream-modulated low-noise magnetoresistive sensors located on the substrate. The X, Y, and Z-axis upstream-modulated low-noise magnetoresistive sensors respectively include X, Y, and Z-axis magnetoresistive sensing unit arrays, X, Y, and Z-axis soft ferromagnetic flux concentrator arrays, and X, Y, and Z-axis modulator wire arrays. The X, Y, and Z-axis magnetoresistive sensing unit arrays are electrically interconnected into X, Y, and Z-axis magnetoresistive sensing bridges respectively. The X, Y, and Z-axis modulator wire arrays are electrically interconnected into individual two-port X, Y, and Z-axis excitation coils. In order to measure external magnetic fields, the two-port X, Y, and Z-axis excitation coils separately supplied with high-frequency alternating current at a frequency f, from a current supply. The X, Y, and Z-axis magnetoresistive sensors each output harmonic signal components having a frequency of 2f, which are then demodulated to obtain the X, Y, and Z-axis low-noise signals.

The X, Y, and Z-axis magnetoresistive sensing unit arrays have the same magnetic field sensing directions, and wafers of the magnetoresistive sensing units are obtained by the same magnetic field annealing process.

The X and Y-axis magnetoresistive sensing unit arrays respectively have +X, −X, +Y, and −Y-axis magnetic field sensing directions, and are respectively obtained by laser program-controlled scanning thermal annealing, and the Z-axis magnetoresistive sensing units have X or Y-axis magnetic field sensing directions.

The X-axis magnetoresistive sensor and the Y-axis magnetoresistive sensor are obtained by rotating the dice by 90 degrees, 180 degrees, and 270 degrees respectively, such that the sensing directions are rotated.

The magnetoresistive sensing units are of a GMR, TMR, or AMR type.

The magnetoresistive sensing unit bridges are half-bridge, full-bridge, or quasi-bridge structures.

The X-axis magnetoresistive sensor is a reference bridge X-axis magnetoresistive sensor, X-axis sensing magnetoresistive sensing unit strings are located at gaps of the X-axis soft ferromagnetic flux concentrator array, X-axis reference magnetoresistive sensing unit strings are located at positions of Y-axis center lines on upper surfaces or lower surfaces of X-axis soft ferromagnetic flux concentrators, the X-axis modulator wires are parallel to the Y-axis center lines and are located in the X-axis soft ferromagnetic flux concentrators, and form a soft ferromagnetic material layer/modulator wire layer/soft ferromagnetic material layer sandwich composite structure with the X-axis soft ferromagnetic flux concentrators, the soft ferromagnetic material layers and the modulator wire layer are isolated through an insulating material layer, and two adjacent ones of the X-axis modulator wires have opposite current directions.

The X-axis magnetoresistive sensor is a referenced X-axis magnetoresistive sensor, the X-axis soft ferromagnetic flux concentrator array includes a sensing soft ferromagnetic flux concentrator and a reference soft ferromagnetic flux concentrator, two X-axis reference magnetoresistive sensing unit strings and two X-axis sensing magnetoresistive sensing unit strings are located at two positions symmetric with respect to a Y-axis center line on upper surfaces or lower surfaces of the reference soft ferromagnetic flux concentrator and the sensing soft ferromagnetic flux concentrator respectively, the X-axis modulator wires are located in the reference soft ferromagnetic flux concentrator and the sensing soft ferromagnetic flux concentrator respectively and are parallel to the Y-axis center line thereof, and form a soft ferromagnetic material layer/modulator wire layer/soft ferromagnetic material layer sandwich composite structure with the soft ferromagnetic flux concentrators, the soft ferromagnetic material layers and the modulator wire layer are isolated through an insulating material layer, and two adjacent ones of the X-axis modulator wires have opposite current directions.

The X-axis magnetoresistive sensor is an X-axis push-pull bridge magnetoresistive sensor with U-shaped soft ferromagnetic flux concentrators, the push magnetoresistive sensing unit strings and the pull magnetoresistive sensing unit strings are alternately located in interdigitated gaps of the U-shaped soft ferromagnetic flux concentrators respectively, the modulator wires are located in interdigitations of the U-shaped soft ferromagnetic flux concentrators, and form a soft ferromagnetic material layer/modulator wire layer/soft ferromagnetic material layer sandwich composite structure, the soft ferromagnetic material layers and the modulator wire layer are isolated through an insulating material layer, and two adjacent ones of the modulator wires have opposite current directions.

The X-axis magnetoresistive sensor is a H-type soft ferromagnetic flux concentrator/U-type soft ferromagnetic flux concentrator hybrid X-axis push-pull bridge magnetoresistive sensor, the push magnetoresistive sensing unit strings and the pull magnetoresistive sensing unit strings are alternately located in interdigitated gaps of the U-H hybrid structure respectively, the modulator wires are located in the interdigitations, the soft ferromagnetic material layers and the modulator wire layer are isolated through an insulating material layer, and two adjacent ones of the modulator wires have opposite current directions.

The Y-axis magnetoresistive sensor is a Y-axis comb-shaped interdigitated push-pull bridge magnetoresistive sensor, the push magnetoresistive sensing unit strings and the pull magnetoresistive sensing unit strings are alternately located in the interdigitated gaps, the modulator wires are located in the interdigitations, so as to form a soft ferromagnetic material layer/modulator wire layer/soft ferromagnetic material layer sandwich composite structure, the soft ferromagnetic material layers and the modulator wire layer are isolated through an insulating material layer, two adjacent ones of the modulator wires have opposite current directions, and the X-axis connection wire is located in a region away from the comb seat; or the modulator wires are located in the comb seats to form a soft ferromagnetic material layer/modulator wire layer/soft ferromagnetic material layer sandwich composite structure, and the modulator wires in two comb seats have opposite current directions.

The Y-axis magnetoresistive sensor is a push-pull bridge magnetoresistive sensor with a soft ferromagnetic flux concentrator block array, the Y-axis soft ferromagnetic flux concentrator array includes a N rows×M columns soft ferromagnetic flux concentrator block array I and a N−1 rows×M columns soft ferromagnetic flux concentrator block array II that are misaligned along a Y direction respectively, the push magnetoresistive sensing unit and the pull magnetoresistive sensing unit are alternately located in a gap between the soft ferromagnetic flux concentrator block array I and the soft ferromagnetic flux concentrator block array II, the modulator wires are alternately arranged along rows of soft ferromagnetic flux concentrator blocks in the array I and the array II and form a soft ferromagnetic material layer/modulator wire layer/soft ferromagnetic material layer sandwich composite structure with the soft ferromagnetic blocks, and adjacent ones of the modulator wires have opposite current directions.

The Z-axis magnetoresistive sensor is a pull-push bridge magnetoresistive sensor including a soft ferromagnetic flux concentrator array, the push magnetoresistive sensing unit string and the pull magnetoresistive sensing unit string are located at two positions on upper surfaces or lower surfaces of the soft ferromagnetic flux concentrators and symmetric with respect to a Y-axis center line, the modulator wires are located in the soft ferromagnetic flux concentrators to form a soft ferromagnetic material layer/modulator wire layer/soft ferromagnetic material layer sandwich composite structure, and adjacent ones of the modulator wires have opposite current directions.

Both the X-axis magnetoresistive sensor and the Y-axis magnetoresistive sensor are a multilayer structured upstream-modulated low-noise magnetoresistive sensor, including an X-axis soft ferromagnetic flux concentrator array and a Y-axis soft ferromagnetic flux concentrator array, the X push magnetoresistive sensing unit strings and the X pull magnetoresistive sensing unit strings are located at gaps of the X-axis soft ferromagnetic flux concentrators respectively, and the Y push magnetoresistive sensing unit strings and the Y pull magnetoresistive sensing unit strings are located at gaps of the Y-axis soft ferromagnetic flux concentrators respectively.

Compared with the prior art, the present invention has the following beneficial effects:

In the X, Y, and Z-axis magnetoresistive sensors, movement of a measurement signal from a low frequency to a high frequency is implemented and noise of the magnetoresistive sensors is reduced by using stationary soft ferromagnetic flux concentrator structures and alternating current. Moreover, the three-axis upstream-modulated low-noise magnetoresistive sensor formed by the X, Y, and Z-axis magnetoresistive sensors is simple in structure, small in size, and the manufacturing process is simple.

BRIEF DESCRIPTION OF THE DRAWINGS

In order to illustrate the technical solution with embodiments of the present invention and also to describe the prior art more clearly, the accompanying drawings used in the descriptions about the present embodiments and the prior art will be introduced briefly below. It is apparent that the accompanying drawings in the following descriptions are merely some of the many possible embodiments of the present invention. Those of ordinary skill in the art can also obtain other drawings based on the accompanying drawings without creative efforts.

DETAILED DESCRIPTION

To make the objectives, technical solutions, and advantages of the embodiments of the present invention much clearer, the technical solutions in the embodiments of the present invention will be described clearly and completely below with reference to the accompanying drawings in the embodiments of the present invention. It is apparent that the described embodiments are some of, rather than all, the embodiments of the present invention.

The present invention will be described in detail below with reference to the accompanying drawings in combination with embodiments. The present invention is aimed at providing an XYZ three-axis upstream-modulated low-noise magnetoresistive sensor, including an X-axis magnetoresistive sensor, a Y-axis magnetoresistive sensor, and a Z-axis magnetoresistive sensor. For specific structures of the X-axis magnetoresistive sensor, the Y-axis magnetoresistive sensor, and the Z-axis magnetoresistive sensor, reference can be made to Embodiment 1, Embodiment 2, and Embodiment 3 respectively; and for the XYZ three-axis upstream-modulated low-noise magnetoresistive sensor formed by the X, Y, and Z-axis magnetoresistive sensors, reference can be made to Embodiment 4.

Embodiment 1

Figure 1:
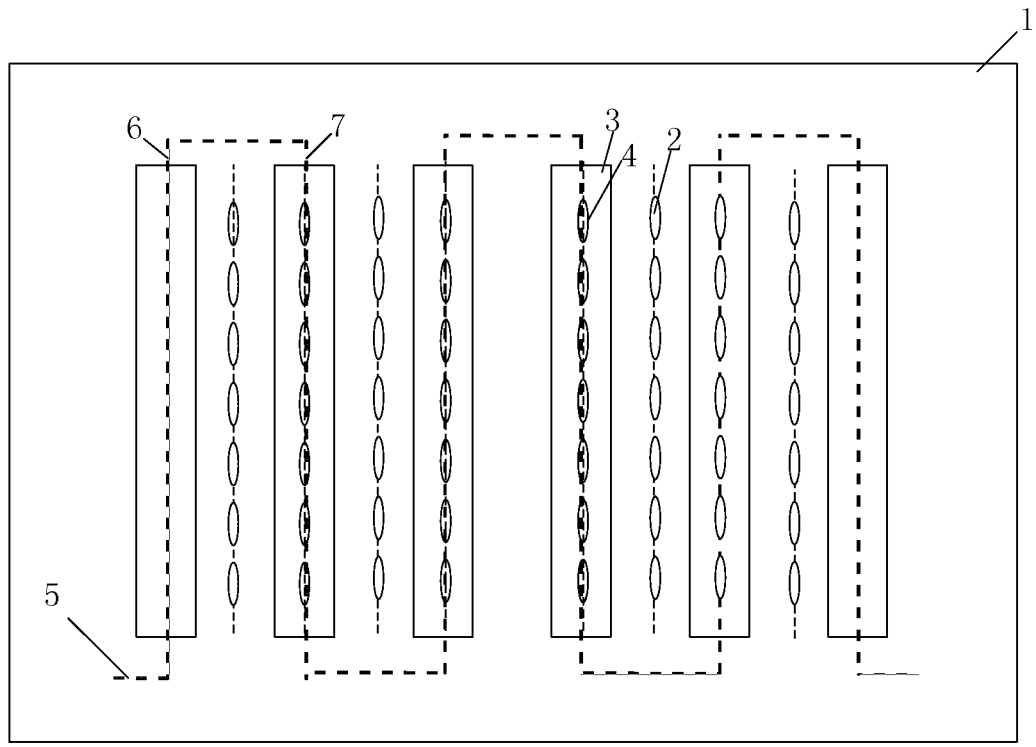
FIG. 1 is a schematic diagram of a first upstream-modulated structure of a reference bridge X-axis magnetoresistive sensor.

FIG. 1 is a structural diagram of a first reference bridge upstream-modulated low-noise X-axis magnetoresistive sensor. 1 denotes a region where the sensor is located, 2 denotes a sensing magnetoresistive sensing unit string located in a gap of a soft ferromagnetic flux concentrator array, 4 denotes a reference magnetoresistive sensing unit string located at a Y-axis center on an upper surface or a lower surface of a soft ferromagnetic flux concentrator 3, a two-port modulator wire coil 5 includes a modulator wire array located in the soft ferromagnetic flux concentrator, and adjacent modulator wires 6 and 7 have opposite current directions.

Figure 2:
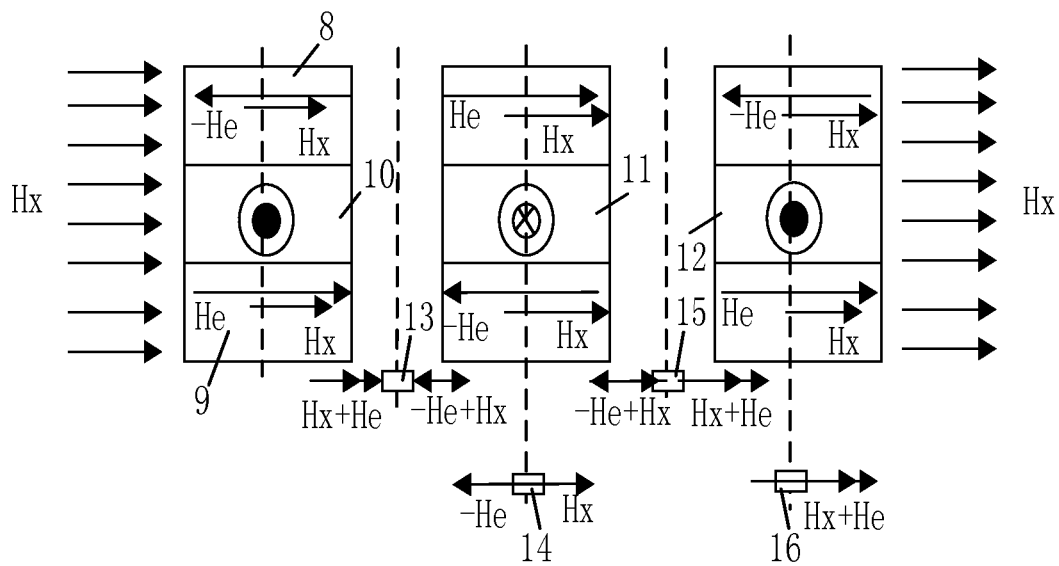
FIG. 2 is a distribution diagram of an external magnetic field of the first upstream-modulated structure of the reference bridge X-axis magnetoresistive sensor.
Figure 3:
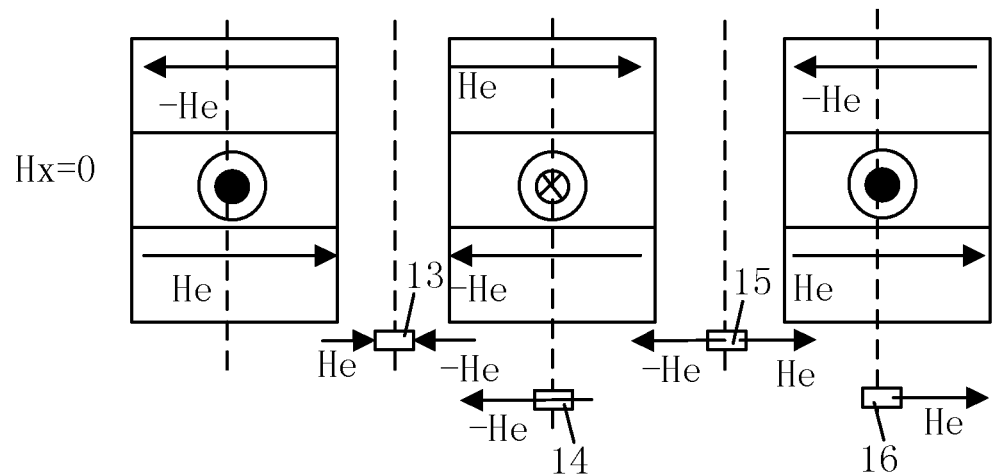
FIG. 3 is a distribution diagram of an excitation magnetic field of the first upstream-modulated structure of the reference bridge X-axis magnetoresistive sensor.

FIG. 2 and FIG. 3 are working principle diagrams of the reference bridge upstream-modulated low-noise X-axis magnetoresistive sensor 1. Modulator wires 10 and 11 are located in the soft ferromagnetic flux concentrator and form a composite multilayer film structure including a soft ferromagnetic material layer 8, a wire layer 10, and a soft ferromagnetic material layer 9, and the soft ferromagnetic material layers and the wire layer are isolated through an insulating material layer. Two adjacent modulator wires 10 and 11 as well as 11 and 12 have opposite current directions. Excitation current of the modulator wires generates magnetic fields −He and He with opposite directions in the soft ferromagnetic material layer 8 and the soft ferromagnetic material layer 9. On the other hand, an external magnetic field Hx acts on all the soft ferromagnetic material layers, and a magnetic field sensed by a sensing magnetoresistive sensing unit 13 is a vector superposition of magnetic fields generated by two adjacent soft ferromagnetic material layers. It can be seen that adjacent sensing magnetoresistive sensing units 15 have the same magnetic field vector sum as the sensing magnetoresistive sensing unit 13. FIG. 3 is a distribution diagram of magnetic fields when the external magnetic field Hx is 0. The magnetic fields −He and He generated by the two adjacent soft ferromagnetic material layers in the sensing magnetoresistive sensing unit are equal in magnitude and opposite in direction. When the external magnetic field is introduced, the magnetic field of one of the soft ferromagnetic material layers is enhanced, while the magnetic field of the other of the soft ferromagnetic material layers is reduced, so they have different permeability, similar to fluxgates. Therefore, the external magnetic field in the sensing magnetoresistive sensing unit will be modulated into a magnetic field signal that excites a frequency of a magnetic field, and be measured by the sensing magnetoresistive sensing unit. For the reference magnetoresistive sensing unit 15, when the external magnetic field Hx is 0, excitation magnetic field components corresponding to two adjacent reference magnetoresistive sensing units 14 and 16 are 0. Under the action of the external magnetic field, two adjacent soft ferromagnetic material layers have different magnetization states, and the external magnetic field has the same frequency variation after being modulated by an excitation magnetic field. In this way, an output signal of a reference magnetoresistive sensor is modulated into an output signal at a frequency f.

Figure 4:
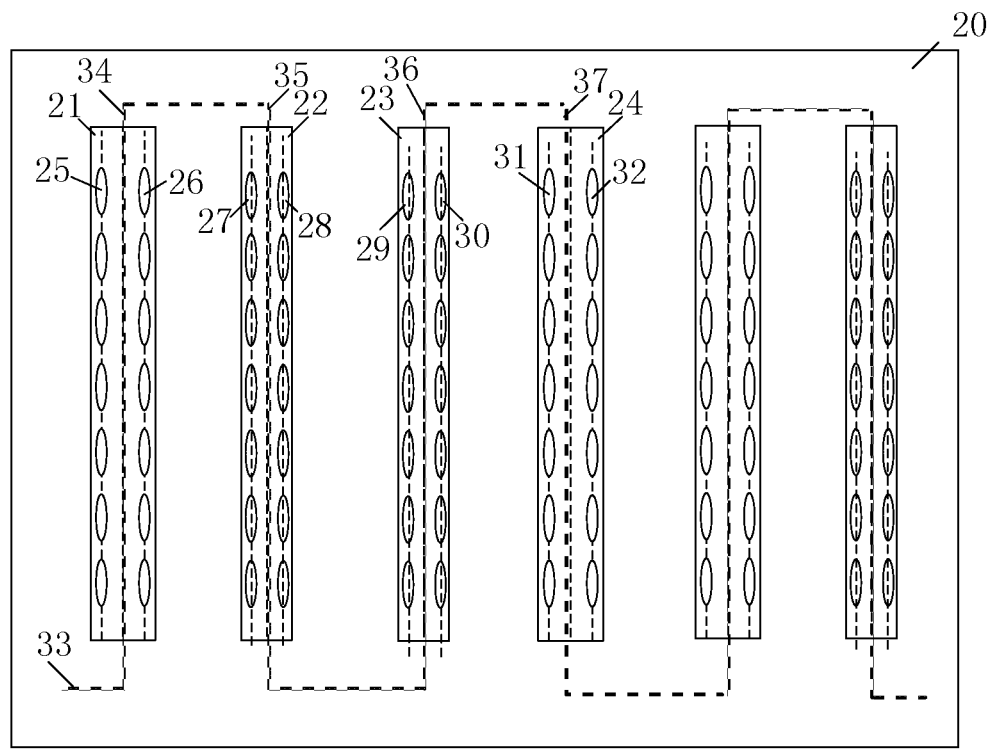
FIG. 4 is a schematic diagram of a second upstream-modulated structure of the reference bridge X-axis magnetoresistive sensor.

FIG. 4 is a structural diagram of a second reference bridge upstream-modulated low-noise X-axis magnetoresistive sensor. 20 denotes a region where the sensor is located, including two sets of soft ferromagnetic flux concentrators with different widths, namely, wide flux concentrators 21, 24 and narrow flux concentrators 22, 23, and their arrangement relation is wide/wide/narrow/wide/wide/wide. That is, except the soft ferromagnetic flux concentrators at two ends, the soft ferromagnetic flux concentrators in the middle are adjacent to each other in pairs. Each soft ferromagnetic flux concentrator corresponds to a set of magnetoresistive sensing unit strings, which are respectively located on two sides of a Y-axis center line of an upper surface or a lower surface of the soft ferromagnetic flux concentrator at the same distance, for example, magnetoresistive sensing unit string pairs 25 and 26 as well as 31 and 32 respectively corresponding to the wide flux concentrators 21, 24, and magnetoresistive sensing unit string pairs 27 and 28 as well as 29 and 30 corresponding to the narrow flux concentrators 22, 23. The modulator wire 33 includes modulator wire arrays 34, 35, 36, and 37 located in the soft ferromagnetic flux concentrator, and two adjacent modulator wires have opposite excitation current directions.

Figure 5:
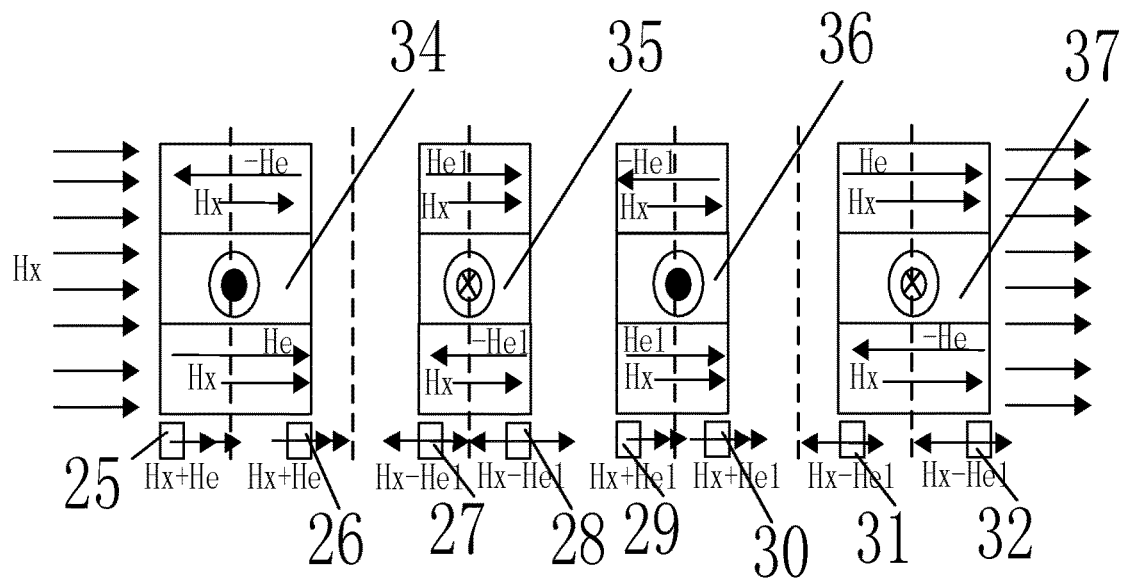
FIG. 5 is a distribution diagram of an external magnetic field of the second upstream-modulated structure of the reference bridge X-axis magnetoresistive sensor.
Figure 6:
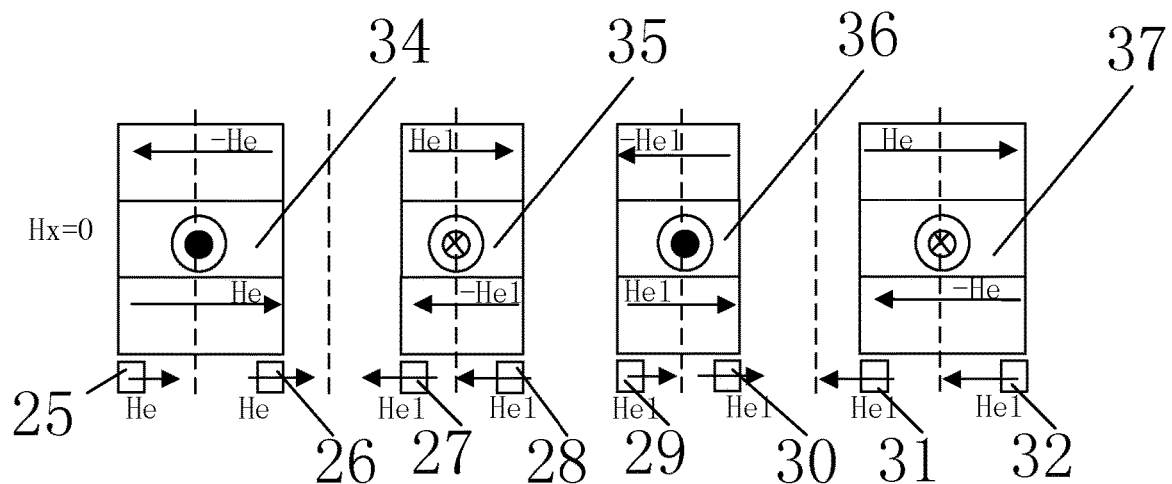
FIG. 6 is a distribution diagram of an excitation magnetic field of the second upstream-modulated structure of the reference bridge X-axis magnetoresistive sensor.

FIG. 5 and FIG. 6 respectively show a modulation effect of an excitation current on a magnetoresistive sensing unit string in the presence of an external magnetic field Hx and a distribution diagram of excitation current magnetic fields −He and He at the magnetoresistive sensing unit string when the external magnetic field Hx is 0. In FIG. 5, sensing magnetoresistive sensing units 25 and 26 sense a combined effect of an excitation magnetic field and an external magnetic field, that is, Hx+He, while 31 and 32 sense magnetic fields which are Hx−He. Correspondingly, in FIG. 6, the magnetoresistive sensing units 25 and 26 sense external excitation magnetic fields which are He and −He. When there is no external magnetic field, the average magnetic field sensed by the magnetoresistive sensing units is 0. When an external magnetic field is applied, its balance is destroyed, in which an excitation magnetic field of one side is enhanced and an excitation magnetic field of the other side is reduced. Therefore, the permeability of soft ferromagnetic materials is in different states, which is similar to a fluxgate. Thus, the variation of the external magnetic field will be modulated to the variation of the excitation magnetic field at the same frequency and be output by a signal at two ends of the magnetoresistive sensing units. Similarly, for the magnetoresistive sensing units 27 and 29, the variation of the external magnetic field thereof is also modulated to the variation of the excitation magnetic field at the same frequency and be output by a signal at two ends of the magnetoresistive sensing units. At the same time, due to different attenuation ratios of the wide and narrow soft ferromagnetic flux concentrators to the external magnetic fields, a new X-axis reference bridge upstream-modulated magnetoresistive sensor will be obtained by taking one of them as a reference magnetoresistive sensing unit and the other as a sensing magnetoresistive sensing unit.

Figure 7:
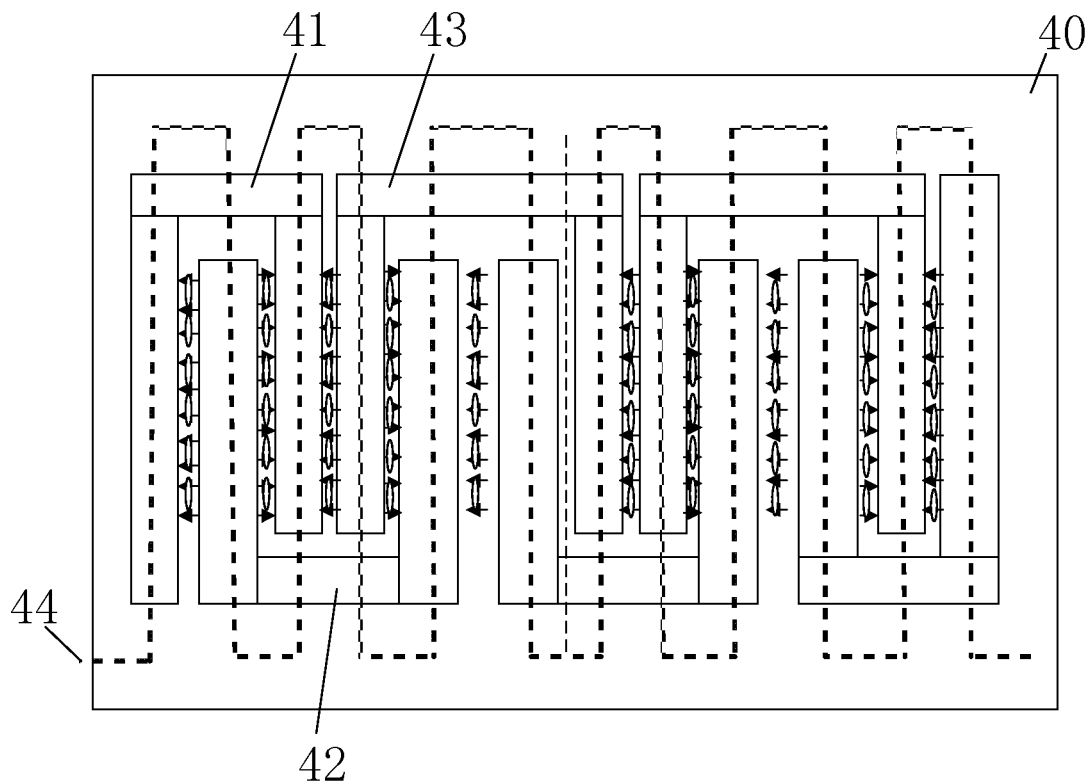
FIG. 7 is a diagram of an upstream-modulated structure of a push-pull bridge X-axis magnetoresistive sensor with U-shaped soft ferromagnetic flux concentrators.

FIG. 7 is a structural diagram of an X push-pull bridge magnetoresistive sensor with a U-shaped soft ferromagnetic flux concentrator structure. 40 denotes a region where the sensor is located, including a plurality of U-shaped soft ferromagnetic flux concentrators 41, 43 opened toward +Y and U-shaped soft ferromagnetic flux concentrators 42 opened toward −Y. Each U-shaped soft ferromagnetic flux concentrator has two interdigitations, the interdigitations of the U-shaped soft ferromagnetic flux concentrators opened toward +Y and the interdigitations of the U-shaped soft ferromagnetic flux concentrators opened toward −Y are interleaved to form interdigitated gaps, and push magnetoresistive sensing unit strings 45 and pull magnetoresistive sensing unit strings are alternately located in the interdigitated gaps. Modulator wires 44 are located in the interdigitations of the U-shaped soft ferromagnetic flux concentrators, and adjacent ones of the wires have opposite current directions.

Figure 8:
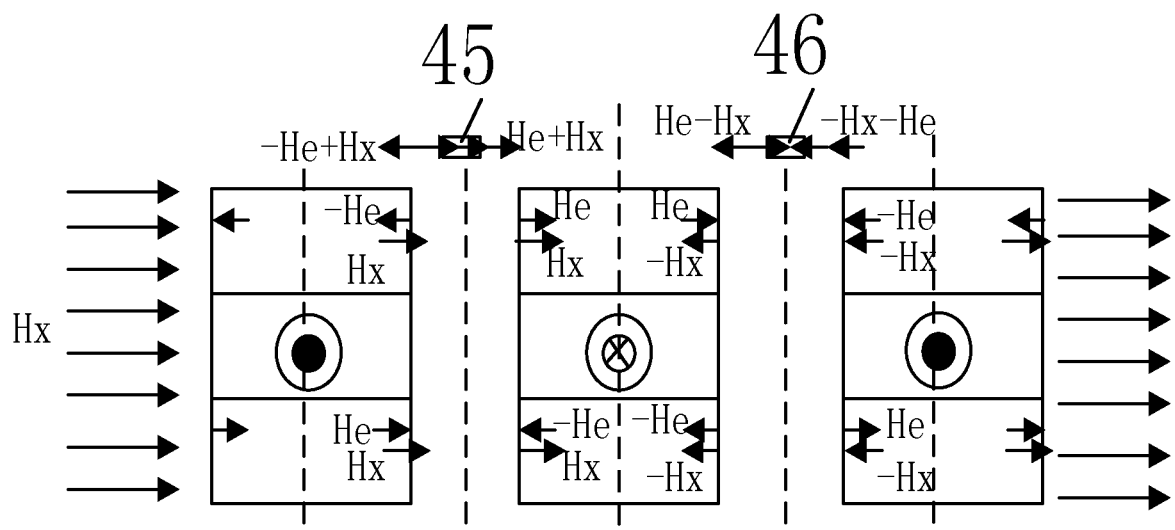
FIG. 8 is a distribution diagram of an external magnetic field of the upstream-modulated structure of the push-pull bridge X-axis magnetoresistive sensor with U-shaped soft ferromagnetic flux concentrators.
Figure 9:
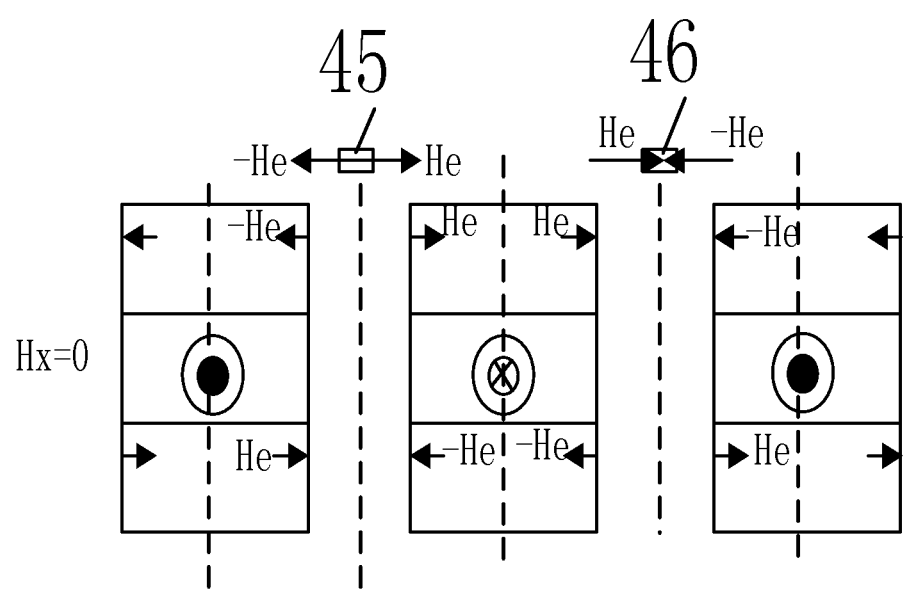
FIG. 9 is a distribution diagram of an excitation magnetic field of the upstream-modulated structure of the push-pull bridge X-axis magnetoresistive sensor with U-shaped soft ferromagnetic flux concentrators.

FIG. 8 and FIG. 9 are respectively magnetic field distribution diagrams of excitation magnetic fields −He and He and an external magnetic field Hx at positions of a push magnetoresistive sensing unit string and a pull magnetoresistive sensing unit string in the presence of the external magnetic field Hx and in the absence of the external magnetic field Hx. It can be seen that in the presence of the external magnetic field, the push magnetoresistive sensing unit 45 and the pull magnetoresistive sensing unit 46 have opposite magnetic field distribution features, magnetic fields generated by the soft ferromagnetic layer on one side are He+Hx, while magnetic fields generated by the soft ferromagnetic layer on the other side is Hx−He. When there is no external magnetic field, the vector sum of the magnetic fields thereof is 0. Therefore, it is in line with the modulation effect of soft ferromagnetic materials on the external magnetic field under the condition of high-frequency excitation magnetic fields.

Figure 10:
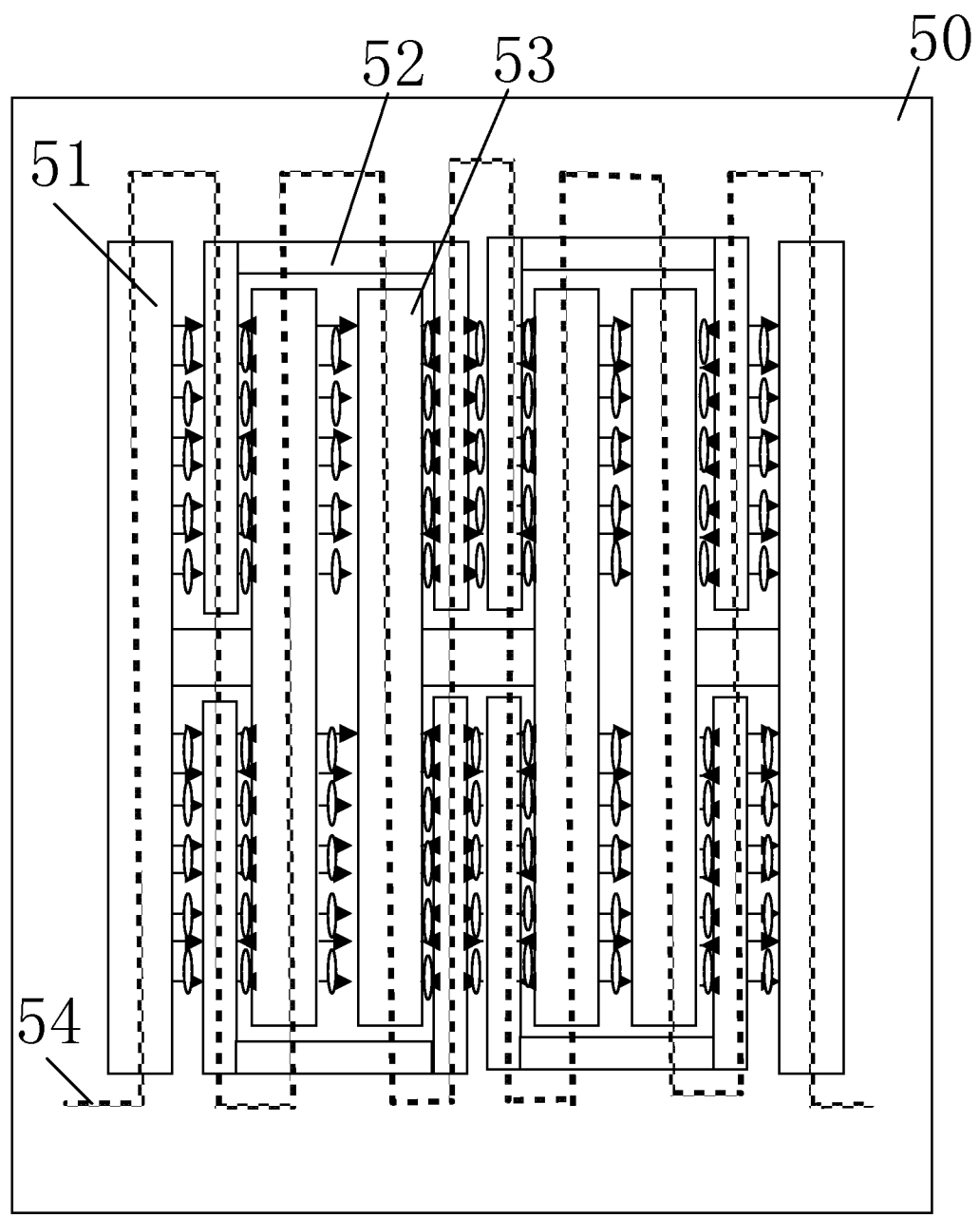
FIG. 10 is a diagram of an upstream-modulated structure of a push-pull bridge X-axis magnetoresistive sensor with U-shaped and H-shaped soft ferromagnetic flux concentrators.

FIG. 10 shows an interdigitated X push-pull bridge magnetoresistive sensor with U-shaped and H-shaped soft ferromagnetic flux concentrators. 50 denotes a region where the sensor is located. Two adjacent H-shaped soft ferromagnetic flux concentrators 51 and 53 each have an opening toward the Y direction. Moreover, 51 and 53 are an interdigitated through a U-shaped soft ferromagnetic flux concentrator 52, and a push magnetoresistive sensing unit and a pull magnetoresistive sensing unit cross each other in an interdigitated gap. 51 denotes modulator wires which are respectively located in the interdigitations, and adjacent ones of the modulator wires have opposite current directions.

The analyses of the working principles of the interdigitated X push-pull bridge magnetoresistive sensor in the presence of an external magnetic field and when the external magnetic field is 0 are the same as those for the X push-pull bridge magnetoresistive sensor with U-shaped soft ferromagnetic flux concentrators.

Embodiment 2

Figure 11:
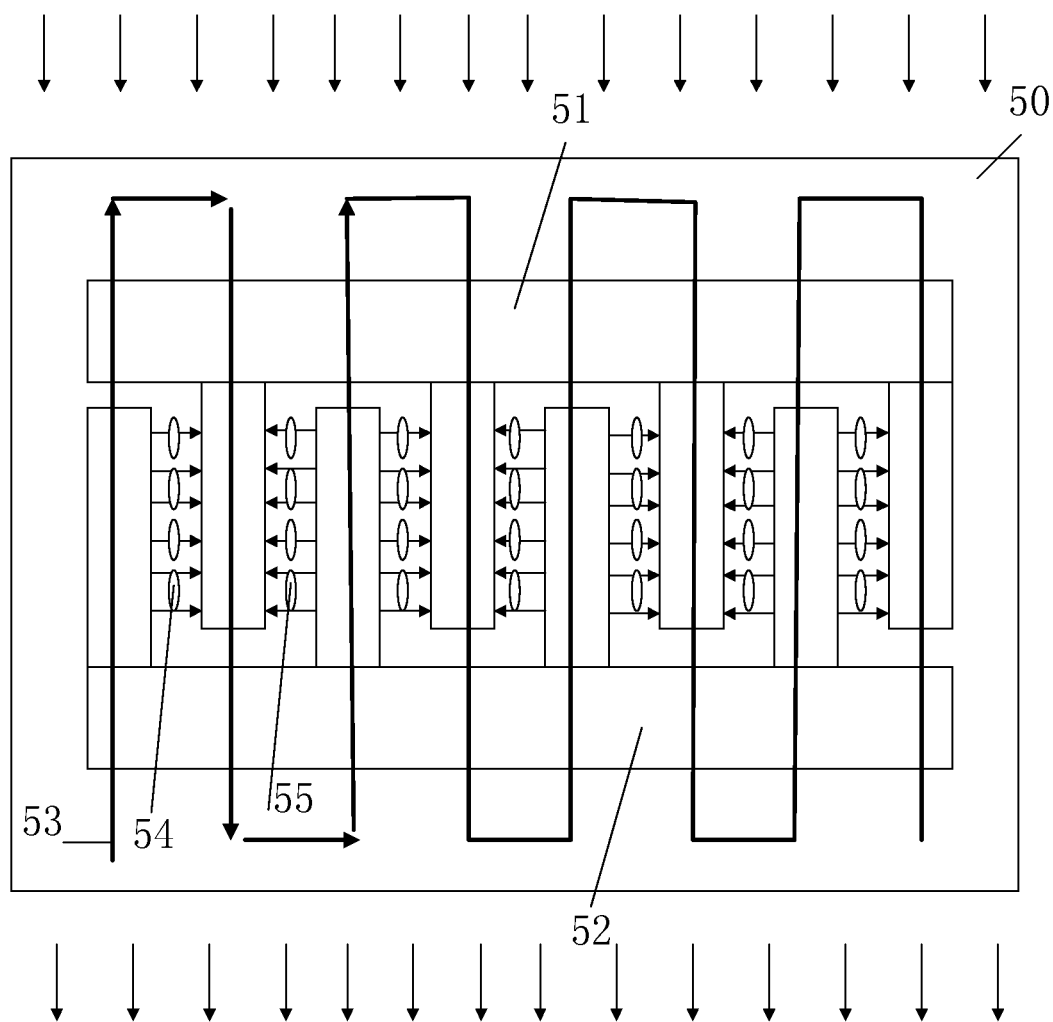
FIG. 11 is a diagram of an upstream-modulated structure of a push-pull bridge Y-axis magnetoresistive sensor with comb-shaped soft ferromagnetic flux concentrators.

FIG. 11 shows a cross-comb Y-axis push-pull bridge magnetoresistive sensor. 50 denotes a region where the sensor is located, including two comb teeth soft ferromagnetic flux concentrators 51 and 52 disposed opposite to each other, opened toward the Y direction, and having an interdigitated structure, that is, each soft ferromagnetic flux concentrator includes a comb seat extending along X and a plurality of interdigitations extending from the comb seat to another soft ferromagnetic flux concentrator. The plurality of interdigitations are arranged at intervals, and the interdigitations of two soft ferromagnetic flux concentrators are interleaved and alternately arranged to form a plurality of interdigitated gaps. Push magnetoresistive sensing unit strings 54 and pull magnetoresistive sensing unit strings 55 are cross-distributed in the interdigitated gaps, modulator wires 53 are distributed in the interdigitations, and two adjacent ones of the modulator wires have opposite current directions. The analyses of the working principles of the cross-comb X-axis push-pull bridge magnetoresistive sensor in the presence of an external magnetic field and when the external magnetic field is 0 are the same as those for the X push-pull bridge magnetoresistive sensor with U-shaped soft ferromagnetic flux concentrators.

Figure 12:
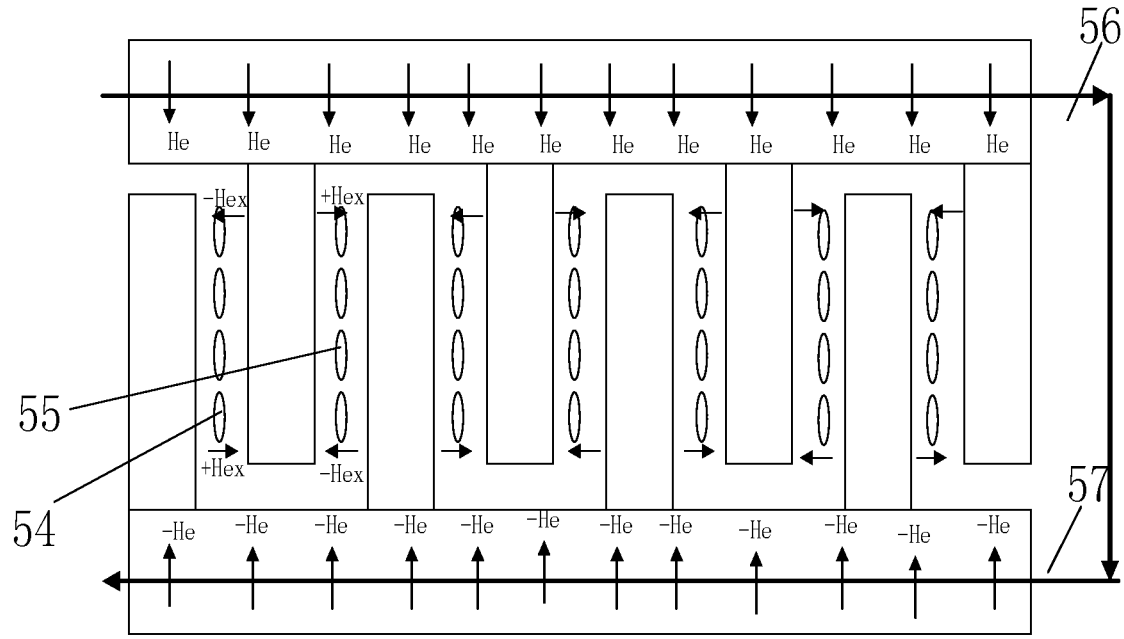
FIG. 12 is a distribution diagram of an excitation magnetic field of the upstream-modulated structure of the push-pull bridge Y-axis magnetoresistive sensor with comb-shaped soft ferromagnetic flux concentrators.
Figure 13:
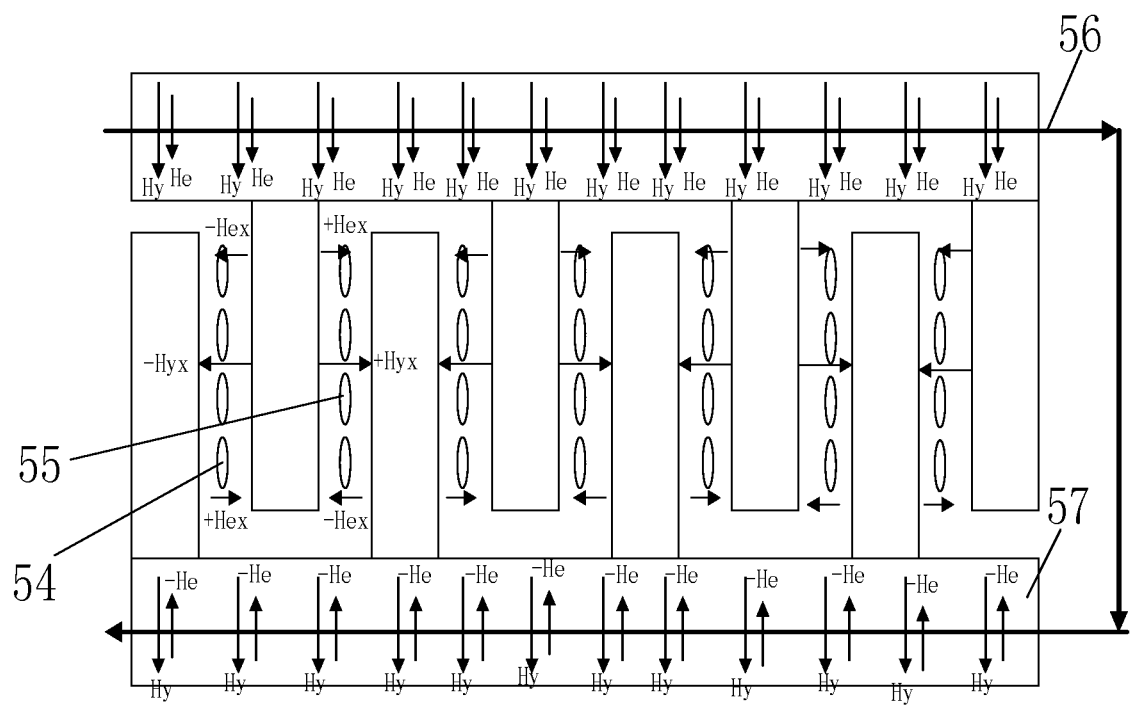
FIG. 13 is a distribution diagram of an external magnetic field of the upstream-modulated structure of the push-pull bridge Y-axis magnetoresistive sensor with comb-shaped soft ferromagnetic flux concentrators.

FIG. 12 and FIG. 13 are schematic diagrams of another upstream-modulated wire structure, including two modulator wires 56 and 57 having opposite current directions, which are respectively located in upper and lower comb seats and have opposite current directions. FIG. 12 shows a situation where there are only excitation magnetic fields without external magnetic fields.

The push magnetoresistive sensing unit strings 54 and the pull magnetoresistive sensing unit strings 55 have opposite excitation magnetic fields, which are 0, and +Hex−Hex cancel out. FIG. 13 shows a situation where an external magnetic field Hy is applied. For the push magnetoresistive sensing unit strings 54, the magnetic field in the −Hyx direction thereof is enhanced, while for the pull magnetoresistive sensing unit strings 55, the magnetic field in the Hyx direction thereof is enhanced. Therefore, the permeability of the soft ferromagnetic material layer changes and the excitation current magnetic fields cannot cancel out, thereby modulating Hyx into the magnetic field at the frequency Hex.

Figure 14:
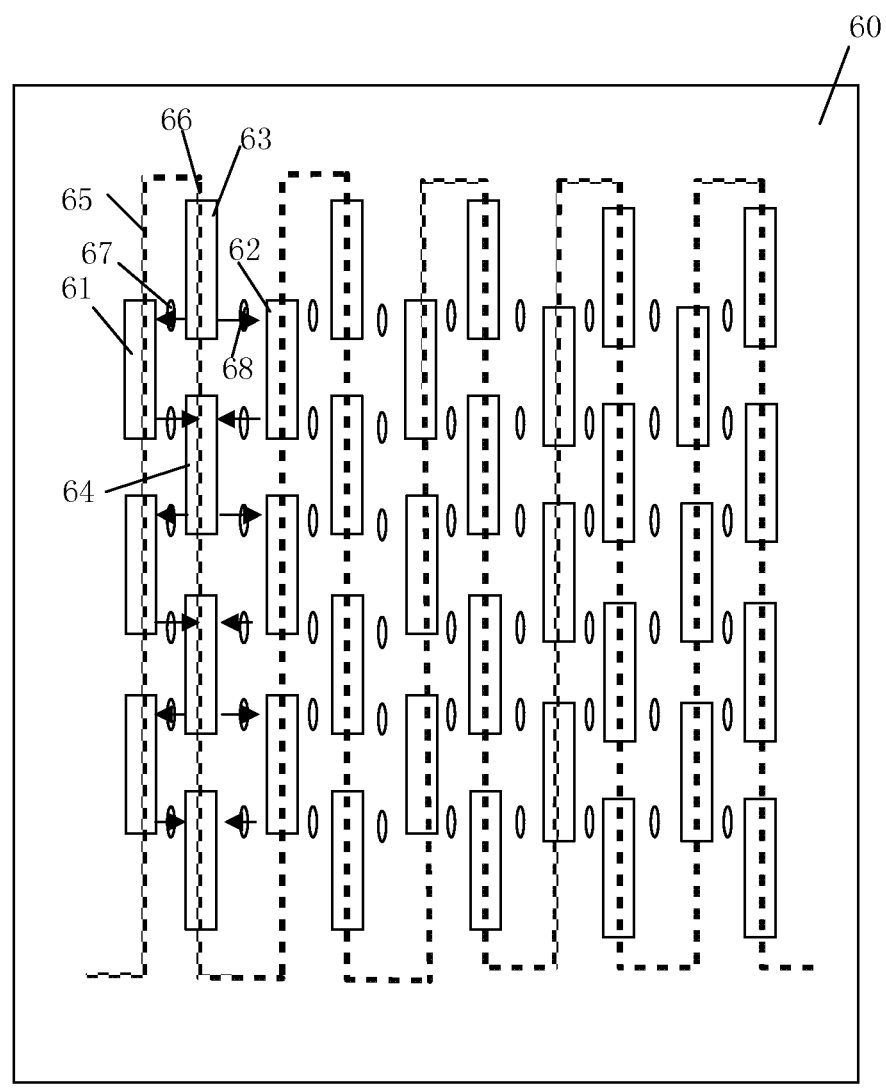
FIG. 14 is a diagram of an upstream-modulated structure of a push-pull bridge Y-axis magnetoresistive sensor with a rectangular array of soft ferromagnetic flux concentrators.

FIG. 14 shows a Y-axis push-pull bridge magnetoresistive sensor with a rectangular block structure of soft ferromagnetic flux concentrators, including two rectangular soft ferromagnetic flux concentrator arrays misaligned. One soft ferromagnetic flux concentrator array 63, 64 is located between another soft ferromagnetic flux concentrator array 61 and 62, is misaligned along the Y-axis, and is located to the left or right of two adjacent gaps.

Under the action of a Y-axis magnetic field, magnetic field distribution thereof is as shown in the figure, in which two adjacent X magnetic field components have opposite magnetic field directions. A modulator wire coil is as shown in FIG. 14. Wires are connected along the Y direction to all soft ferromagnetic flux rectangular blocks, and located in the soft ferromagnetic flux rectangular blocks. Two adjacent modulator wires 65 and 66 have opposite current directions. For any pair of push magnetoresistive sensing unit 67 and pull magnetoresistive sensing unit 68, their magnetic field distribution relationship under the combined effect of an excitation magnetic field and an external magnetic field is the same as that for the X push-pull bridge magnetoresistive sensor with U-shaped soft ferromagnetic flux concentrators.

Embodiment 3

Figure 15:
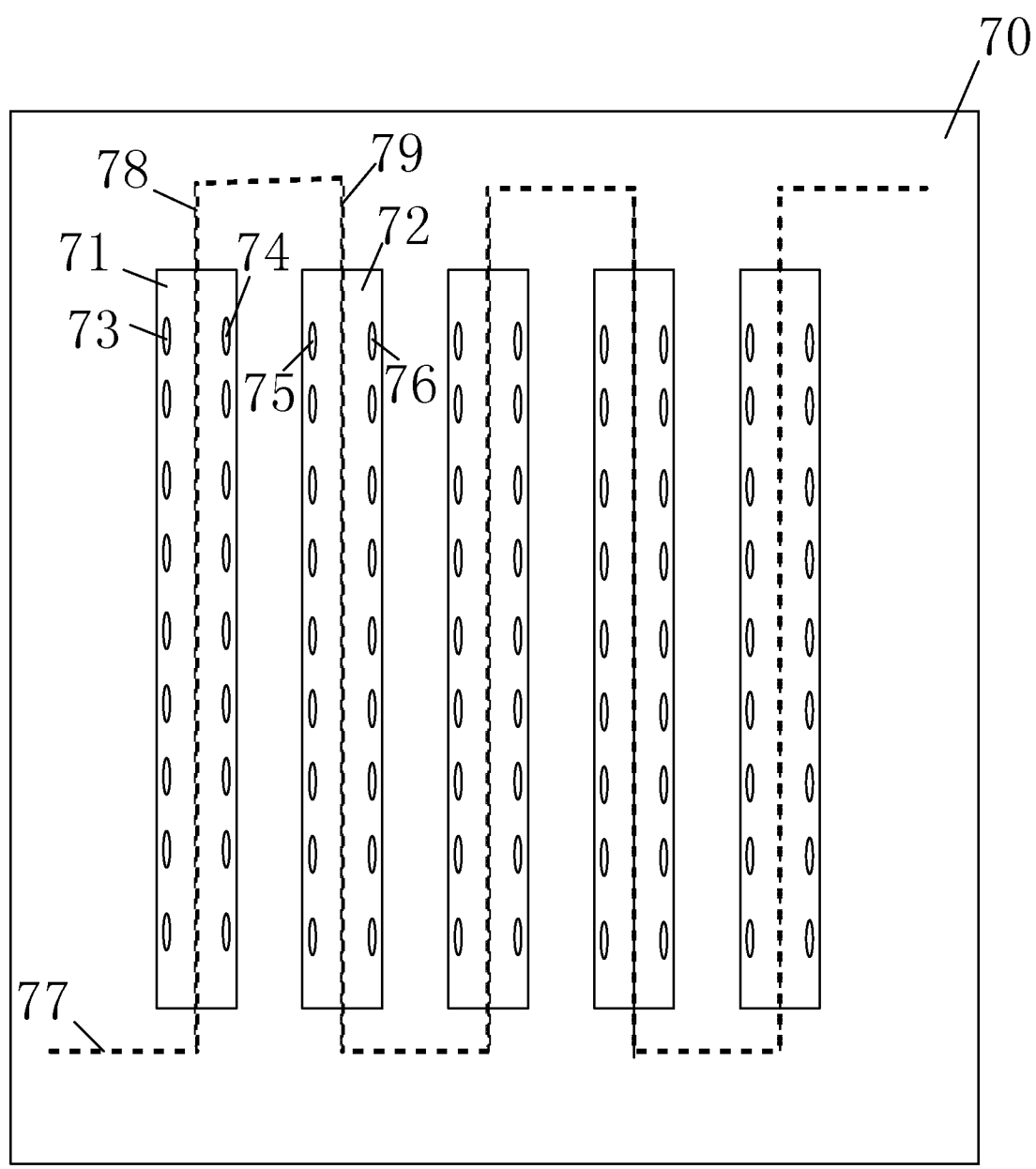
FIG. 15 is a diagram of an upstream-modulated structure of a push-pull bridge Z-axis magnetoresistive sensor.

FIG. 15 shows a Z-axis magnetoresistive push-pull bridge magnetoresistive sensor. 70 denotes a region where the sensor is located. 71 and 72 denote soft ferromagnetic flux concentrator arrays, 73 and 74 as well as 75 and 76 are push magnetoresistive sensing unit strings and pull magnetoresistive sensing unit strings located on upper surfaces or lower surfaces of soft ferromagnetic flux concentrators and equidistant from the Y-axis center line. 77 denotes a modulator wire coil, including modulated wires 78 and 79 located in the soft ferromagnetic flux concentrators, and adjacent modulator wires have opposite current directions.

Figure 16:
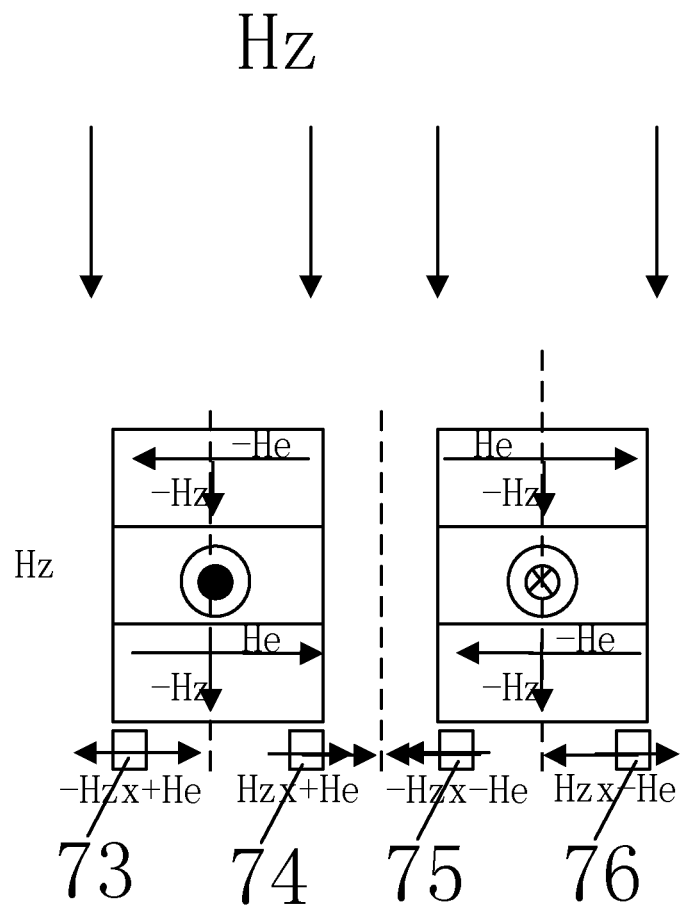
FIG. 16 is a distribution diagram of an external magnetic field of the upstream-modulated structure of the push-pull bridge Z-axis magnetoresistive sensor.
Figure 17:
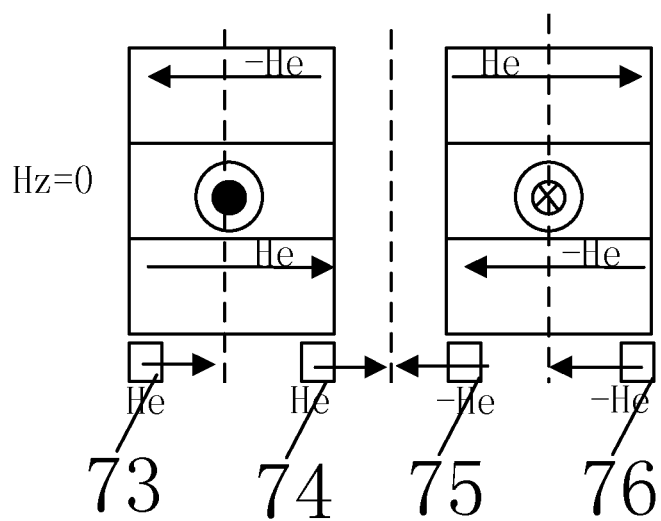
FIG. 17 is a distribution diagram of an excitation magnetic field of the upstream-modulated structure of the push-pull bridge Z-axis magnetoresistive sensor.

FIG. 16 and FIG. 17 are magnetic field distribution of magnetoresistive sensing units 73, 74, 75, and 76 under an excitation magnetic field He in the presence of a Z-axis magnetic field Hz and when the Z-axis magnetic field is 0. It can be seen from FIG. 17 that pull magnetoresistive sensing units 73 and 75 have excitation magnetic fields He and −He respectively when the external magnetic field is 0, and thus the average magnetic field is 0 in case of series connection. FIG. 16 shows transformation of an Hz magnetic field into two magnetic field components Hzx and −Hzx after passing through a soft ferromagnetic flux concentrator. 73 and 75 have the same magnetic field component −Hzx, with the result that one magnetic field increases and the other magnetic field decreases, thereby successfully modulating the frequency of the excitation magnetic field into the signal. In FIGS. 17, 74 and 76 have opposite excitation magnetic fields He and −He, so the average magnetic field is 0, while in FIG. 16, due to the magnetic field component Hzx, magnetic field components opposite to 73 and 75 appear, so after modulation, they are still used as push magnetoresistive sensing units and pull magnetoresistive sensing units.

Embodiment 4

Figure 18:
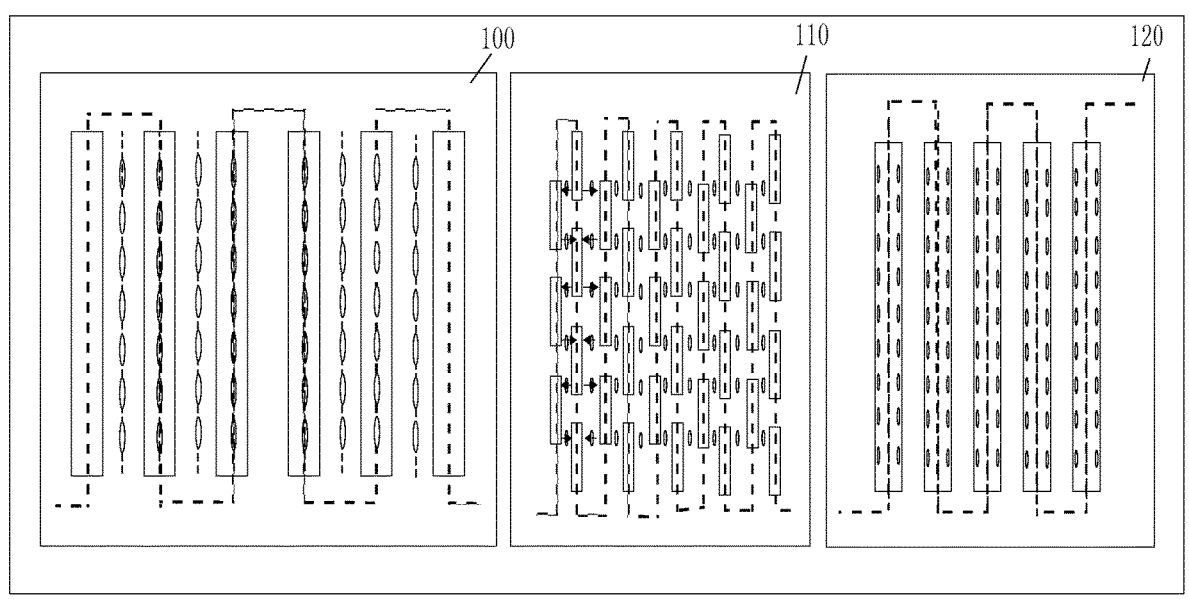
FIG. 18 is a structural diagram of an XYZ three-axis upstream-modulated magnetoresistive sensor.

FIG. 18 is a structural diagram of an XYZ three-axis upstream-modulated low-noise magnetoresistive sensor, including an X-axis upstream-modulated sensor 100 as provided in Embodiment 1, a Y-axis upstream-modulated sensor 110 as provided in Embodiment 2, and a Z-axis upstream-modulated sensor 120 as provided in Embodiment 3.

The above are further detailed descriptions of the present invention in combination with specific preferred implementations, and it cannot be deemed that the specific implementation of the present invention is only limited to these descriptions. For those skilled in the art, it is obvious that this application is not limited to the details of the above exemplary embodiments, and that this application can be implemented in other specific forms without departing from the spirit or basic features of this application. Therefore, in all respects, the embodiments should be regarded as exemplary and non-restrictive, and the scope of this application is limited by the appended claim rather than the above descriptions, and therefore it is intended to include all changes within the meaning and scope of equivalent requirements of the claims in this application. Any reference numerals in the claims shall not be regarded as limiting the claims involved. In addition, it is obvious that the word "include/comprise" does not exclude other units or steps, and a singular form does not exclude a plural form. A plurality of units or apparatuses stated in an apparatus claim may also be implemented by a unit or an apparatus through software or hardware.

The invention claimed is:

1. A three-axis upstream-modulated low-noise magnetoresistive sensor, comprising:
an X-axis magnetoresistive sensor;
a Y-axis magnetoresistive sensor; and
a Z-axis magnetoresistive sensor,
wherein the X-axis magnetoresistive sensor comprises:
an X-axis magnetoresistive sensing unit array,
an X-axis soft ferromagnetic flux concentrator array, and
an X-axis modulator wire array,
wherein the X-axis magnetoresistive sensing unit array is electrically interconnected into an X-axis magnetoresistive sensing bridge, the X-axis modulator wire array is electrically interconnected into a two-port X-axis excitation coil, in order to measure an external magnetic field, the two-port X-axis excitation coil is configured to be supplied with high-frequency alternating current at a frequency f, from a current supply, and the X-axis magnetoresistive sensing bridge is configured to output a harmonic signal component having a frequency of 2f, which is then demodulated to obtain an X-axis low-noise signal;
wherein the Y-axis low-noise magnetoresistive sensor comprises:
a Y-axis magnetoresistive sensing unit array,
a Y-axis soft ferromagnetic flux concentrator array, and
a Y-axis modulator wire array,
wherein the Y-axis magnetoresistive sensing unit array is electrically interconnected into a Y-axis magnetoresistive sensing bridge, the Y-axis modulator wire array is electrically interconnected into a two-port Y-axis excitation coil, in order to measure an external magnetic field, the two-port Y-axis excitation coil is configured to be supplied with high-frequency alternating current at a frequency f, from a current supply, and the Y-axis magnetoresistive sensing bridge is configured to output a harmonic signal component having a frequency of 2f, which is then demodulated to obtain a Y-axis low-noise signal; and
wherein the Z-axis low-noise magnetoresistive sensor comprises:
a Z-axis magnetoresistive sensing unit array,
a Z-axis soft ferromagnetic flux concentrator array, and
a Z-axis modulator wire array,
wherein the Z-axis magnetoresistive sensing unit array is electrically interconnected into a Z-axis magnetoresistive sensing bridge, the Z-axis modulator wire array is electrically interconnected into a two-port Z-axis excitation coil, in order to measure an external magnetic field, the two-port Z-axis excitation coil is configured to be supplied with high-frequency alternating current at a frequency f, from a current supply, and the Z-axis magnetoresistive sensing bridge is configured to output a harmonic signal component having a frequency of 2f, which is then demodulated to obtain a Z-axis low-noise signal.

2. The three-axis upstream-modulated low-noise magnetoresistive sensor according to claim 1, wherein the X-axis magnetoresistive sensing unit array, the Y-axis magnetoresistive sensing unit array, and the Z-axis magnetoresistive sensing unit array have the same magnetic field sensing direction, and wafers of magnetoresistive sensing units forming the X-axis magnetoresistive sensing unit array, the Y-axis magnetoresistive sensing unit array, and the Z-axis magnetoresistive sensing unit array are obtained by the same magnetic field annealing process.

3. The three-axis upstream-modulated low-noise magnetoresistive sensor according to claim 1, wherein the X-axis magnetoresistive sensing unit array has +X-axis and −X-axis magnetic field sensing directions, the Y-axis magnetoresistive sensing unit array has +Y-axis and −Y-axis magnetic field sensing directions, the magnetic field sensing directions of the two are obtained by laser program-controlled scanning thermal annealing respectively, and the Z-axis magnetoresistive sensing units have an X or Y-axis magnetic field sensing direction.

4. The three-axis upstream-modulated low-noise magnetoresistive sensor according to claim 1, wherein the X-axis magnetoresistive sensor and the Y-axis magnetoresistive sensor are obtained by rotating the dice by 90 degrees, 180 degrees, and 270 degrees respectively, such that the sensing directions are rotated.

5. The three-axis upstream-modulated low-noise magnetoresistive sensor according to claim 1, wherein magnetoresistive sensing units forming the X-axis magnetoresistive sensing unit array, the Y-axis magnetoresistive sensing unit array, and the Z-axis magnetoresistive sensing unit array are GMR, TMR, or AMR.

6. The three-axis upstream-modulated low-noise magnetoresistive sensor according to claim 1, wherein the X-axis magnetoresistive sensing bridge, the Y-axis magnetoresistive sensing bridge, and the Z-axis magnetoresistive sensing bridge are a half-bridge, full-bridge, or quasi-bridge structure respectively.

7. The three-axis upstream-modulated low-noise magnetoresistive sensor according to claim 2, wherein the X-axis magnetoresistive sensor is a reference bridge X-axis magnetoresistive sensor, the X-axis magnetoresistive sensing unit array comprises X-axis sensing magnetoresistive sensing unit strings located at gaps of the X-axis soft ferromagnetic flux concentrator array and X-axis reference magnetoresistive sensing unit strings located at positions of Y-axis center lines on upper surfaces or lower surfaces of X-axis soft ferromagnetic flux concentrators, X-axis modulator wires of the X-axis modulator wire array are parallel to the Y-axis center lines and are located in the X-axis soft ferromagnetic flux concentrators, so as to form a soft ferromagnetic material layer/modulator wire layer/soft ferromagnetic material layer composite structure with the X-axis soft ferromagnetic flux concentrators, the soft ferromagnetic material layers and the modulator wire layer are isolated through an insulating material layer, and two adjacent ones of the X-axis modulator wires have opposite current directions.

8. The three-axis upstream-modulated low-noise magnetoresistive sensor according to claim 7, wherein the X-axis soft ferromagnetic flux concentrator array comprises a sensing soft ferromagnetic flux concentrator and a reference soft ferromagnetic flux concentrator, any two adjacent ones of the X-axis reference magnetoresistive sensing unit strings and any two adjacent ones of the X-axis sensing magnetoresistive sensing unit strings are located at two positions symmetric with respect to a Y-axis center line on upper surfaces or lower surfaces of the reference soft ferromagnetic flux concentrator and the sensing soft ferromagnetic flux concentrator respectively, and the X-axis modulator wires are located in the reference soft ferromagnetic flux concentrator or the sensing soft ferromagnetic flux concentrator respectively and are parallel to the Y-axis center line thereof, so as to form the soft ferromagnetic material layer/modulator wire layer/soft ferromagnetic material layer composite structure.

9. The three-axis upstream-modulated low-noise magnetoresistive sensor according to claim 2, wherein the X-axis magnetoresistive sensor is an X-axis push-pull bridge magnetoresistive sensor with U-shaped soft ferromagnetic flux concentrators, the X-axis soft ferromagnetic flux concentrator array comprises a plurality of U-shaped soft ferromagnetic flux concentrators, each of the U-shaped soft ferromagnetic flux concentrators has two interdigitations, the plurality of U-shaped soft ferromagnetic flux concentrators are interleaved so that interdigitated gaps are formed between adjacent U-shaped soft ferromagnetic flux concentrators, the X-axis magnetoresistive sensing unit array comprises push magnetoresistive sensing unit strings and pull magnetoresistive sensing unit strings alternately located in the interdigitated gaps of the U-shaped soft ferromagnetic flux concentrators respectively, modulator wires of the X-axis modulator wire array are located in the interdigitations of the U-shaped soft ferromagnetic flux concentrators, so as to form a soft ferromagnetic material layer/modulator wire layer/soft ferromagnetic material layer composite structure, the soft ferromagnetic material layers and the modulator wire layer are isolated through an insulating material layer, and two adjacent ones of the modulator wires have opposite current directions.

10. The three-axis upstream-modulated low-noise magnetoresistive sensor according to claim 2, wherein the X-axis magnetoresistive sensor is a H-type soft ferromagnetic flux concentrator/U-type soft ferromagnetic flux concentrator hybrid X-axis push-pull bridge magnetoresistive sensor, the X-axis soft ferromagnetic flux concentrator array comprises the H-type soft ferromagnetic flux concentrator and the U-type soft ferromagnetic flux concentrator, the H-type soft ferromagnetic flux concentrator and the U-type soft ferromagnetic flux concentrator are respectively provided with an interdigitation and are interleaved to form an interdigitated gap, the X-axis push-pull bridge magnetoresistive sensing unit array comprises a push magnetoresistive sensing unit string and a pull magnetoresistive sensing unit string alternately located in the interdigitated gap between the H-type soft ferromagnetic flux concentrator and the U-type soft ferromagnetic flux concentrator respectively, modulator wires of the X-axis modulator wire array are located in the interdigitations, so as to form a soft ferromagnetic material layer/modulator wire layer/soft ferromagnetic material layer composite structure, the soft ferromagnetic material layers and the modulator wire layer are isolated through an insulating material layer, and two adjacent ones of the modulator wires have opposite current directions.

11. The three-axis upstream-modulated low-noise magnetoresistive sensor according to claim 2, wherein the Y-axis magnetoresistive sensor is a Y-axis comb-shaped interdigitated push-pull bridge magnetoresistive sensor, the Y-axis soft ferromagnetic flux concentrator array comprises two sets of soft ferromagnetic flux concentrators disposed opposite to each other, each of the two sets of soft ferromagnetic flux concentrators comprises a comb seat and an interdigitation that extends from the comb seat to the other of the two sets of soft ferromagnetic flux concentrators, the interdigitations in the two sets of soft ferromagnetic flux concentrators are interleaved, the Y-axis magnetoresistive sensing unit array comprises a push magnetoresistive sensing unit string and a pull magnetoresistive sensing unit string alternately located in the interdigitated gap, modulator wires of the Y-axis modulator wire array are located in the interdigitations, so as to form a soft ferromagnetic material layer/modulator wire layer/soft ferromagnetic material layer composite structure, the soft ferromagnetic material layers and the modulator wire layer are isolated through an insulating material layer, two adjacent ones of the modulator wires have opposite current directions, and the X-axis connection wire is located in a region away from the comb seat; or the modulator wires are located in the comb seats to form a soft ferromagnetic material layer/modulator wire layer/soft ferromagnetic material layer composite structure, and the modulator wires in two comb seats have opposite current directions.

12. The three-axis upstream-modulated low-noise magnetoresistive sensor according to claim 2, wherein the Y-axis magnetoresistive sensor is a push-pull bridge magnetoresistive sensor with a soft ferromagnetic flux concentrator block array, the Y-axis soft ferromagnetic flux concentrator array comprises a N rows×M columns soft ferromagnetic flux concentrator block array I and a N−1 rows×M columns soft ferromagnetic flux concentrator block array II that are misaligned along a Y direction respectively, the Y-axis magnetoresistive sensing unit array comprises a push magnetoresistive sensing unit and a pull magnetoresistive sensing unit alternately located in a gap between the soft ferromagnetic flux concentrator block array I and the soft ferromagnetic flux concentrator block array II, modulator wires of the Y-axis modulated wire array are alternately arranged along rows of soft ferromagnetic flux concentrator blocks in the soft ferromagnetic flux concentrator block array I and the soft ferromagnetic flux concentrator block array II and form a soft ferromagnetic material layer/modulator wire layer/soft ferromagnetic material layer composite structure with the soft ferromagnetic blocks, and adjacent ones of the modulator wires have opposite current directions.

13. The three-axis upstream-modulated low-noise magnetoresistive sensor according to claim 1, wherein the Z-axis magnetoresistive sensor is a pull-push bridge magnetoresistive sensor comprising a soft ferromagnetic flux concentrator array, the Z-axis magnetoresistive sensing unit array comprises a push magnetoresistive sensing unit string and a pull magnetoresistive sensing unit string, the push magnetoresistive sensing unit string and the pull magnetoresistive sensing unit string are located at two positions on upper surfaces or lower surfaces of the soft ferromagnetic flux concentrators and symmetric with respect to a Y-axis center line, modulator wires of the Z-axis modulator wire array are located in the soft ferromagnetic flux concentrators to form a soft ferromagnetic material layer/modulator wire layer/soft ferromagnetic material layer composite structure, and adjacent ones of the modulator wires have opposite current directions.

14. The three-axis upstream-modulated low-noise magnetoresistive sensor according to claim 1, wherein both the X-axis magnetoresistive sensor and the Y-axis magnetoresistive sensor are a multilayer structured upstream-modulated low-noise magnetoresistive sensor, the X-axis soft ferromagnetic flux concentrator comprises a plurality of X-axis soft ferromagnetic flux concentrators arranged at intervals, the Y-axis soft ferromagnetic flux concentrator comprises a plurality of Y-axis soft ferromagnetic flux concentrators arranged at intervals, the X-axis magnetoresistive sensing unit array comprises X push magnetoresistive sensing unit strings and X pull magnetoresistive sensing unit strings located at gaps of the X-axis soft ferromagnetic flux concentrators respectively, and the Y-axis magnetoresistive sensing unit array comprises Y push magnetoresistive sensing unit strings and Y pull magnetoresistive sensing unit strings located at gaps of the Y-axis soft ferromagnetic flux concentrators respectively.

* * * * *